(12) United States Patent
Matsumoto et al.

(10) Patent No.: US 10,211,023 B2
(45) Date of Patent: Feb. 19, 2019

(54) APERTURE SET FOR MULTI-BEAM AND MULTI-CHARGED PARTICLE BEAM WRITING APPARATUS

(71) Applicant: NuFlare Technology, Inc., Yokohama-shi (JP)

(72) Inventors: Hiroshi Matsumoto, Yokohama (JP); Hiroshi Yamashita, Sagamihara (JP); Kenichi Kataoka, Setagaya-ku (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/854,303

(22) Filed: Dec. 26, 2017

(65) Prior Publication Data

US 2018/0182593 A1    Jun. 28, 2018

(30) Foreign Application Priority Data

Dec. 28, 2016    (JP) .................................. 2016-255362

(51) Int. Cl.
*H01J 37/30*    (2006.01)
*H01J 37/31*    (2006.01)
(Continued)

(52) U.S. Cl.
CPC .......... *H01J 37/09* (2013.01); *H01J 37/3177* (2013.01)

(58) Field of Classification Search
USPC ................... 250/492.1, 492.2, 492.3, 515.1
See application file for complete search history.

(56) References Cited

U.S. PATENT DOCUMENTS 5,214,289 A * 5/1993 Betsui ................... H01J 37/045
                                                        250/396 R
5,260,579 A * 11/1993 Yasuda ................. B82Y 10/00
                                                        250/398
(Continued)

FOREIGN PATENT DOCUMENTS

CN        100565246 C    12/2009
JP        4421836        2/2010
(Continued)

OTHER PUBLICATIONS

Combined Taiwanese Office Action and Search Report dated Sep. 14, 2018 in Taiwanese Patent Application No. 106142868, 5 pages.

*Primary Examiner* — Bernard Souw
(74) *Attorney, Agent, or Firm* — Oblon, McClelland, Maier & Neustadt, L.L.P.

(57) ABSTRACT

In one embodiment, an aperture set for a multi-beam includes a shaping aperture array in which a plurality of first openings are formed, a region including the plurality of first openings is irradiated with a charged particle beam discharged from a discharge unit, and portions of the charged particle beam pass through the plurality of respective first openings to form a multi-beam, a first shield plate in which a plurality of second openings is formed, through which a corresponding beam in the multi-beam, which passes through the plurality of first openings, passes, and a blanking aperture array in which a plurality of third openings is formed, through which a corresponding beam in the multi-beam, which passes through the plurality of first openings and the plurality of second openings, passes. The second openings are wider than the first openings.

20 Claims, 6 Drawing Sheets

(51) Int. Cl.
    *H01J 37/09*     (2006.01)
    *H01J 37/317*     (2006.01)

(56) References Cited

U.S. PATENT DOCUMENTS

| | | | | |
|---|---|---|---|---|
| 5,528,048 A * | 6/1996 | Oae | ......... | B82Y 10/00 |
| | | | | 250/492.2 |
| 6,014,200 A * | 1/2000 | Sogard | ......... | B82Y 10/00 |
| | | | | 250/492.3 |
| 6,768,125 B2 * | 7/2004 | Platzgummer | ......... | B82Y 10/00 |
| | | | | 250/492.1 |
| 8,368,015 B2 * | 2/2013 | Platzgummer | ......... | B82Y 10/00 |
| | | | | 250/306 |
| 8,890,094 B2 * | 11/2014 | Wieland | ......... | B82Y 10/00 |
| | | | | 250/396 R |
| 2006/0060798 A1 * | 3/2006 | Miyagawa | ......... | G03F 7/70291 |
| | | | | 250/492.22 |
| 2016/0155604 A1 | 6/2016 | Matsumoto | | |

FOREIGN PATENT DOCUMENTS

| | | |
|---|---|---|
| JP | 4477433 | 6/2010 |
| JP | 2011-171713 | 9/2011 |
| TW | 200616001 A | 5/2006 |
| TW | 201142905 A1 | 12/2011 |
| TW | 201324571 A1 | 6/2013 |
| TW | 201539117 A | 10/2015 |
| WO | WO 2012/124319 A1 | 9/2012 |

* cited by examiner

THIN SHIELD PLATE

THICK SHIELD PLATE

APERTURE SET FOR MULTI-BEAM AND MULTI-CHARGED PARTICLE BEAM WRITING APPARATUS

CROSS REFERENCE TO RELATED APPLICATION

This application is based upon and claims benefit of priority from the Japanese Patent Application No. 2016-255362, filed on Dec. 28, 2016, the entire contents of which are incorporated herein by reference.

FIELD

The present invention relates to an aperture set for multi-beam and a multi-charged particle beam writing apparatus.

BACKGROUND

With an increase in the packing density of LSIs, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is written by using an electron-beam writing apparatus, in which a so-called electron-beam lithography technique is employed.

A writing apparatus using a multi-beam can irradiate with many beams at once, as compared with the case where writing is performed by a single electron beam, thus the throughput can be significantly improved. In a multi-beam writing apparatus that uses a blanking aperture array, which is one form of multi-beam writing apparatus, for instance, electron beams discharged from an electron gun are passed through a shaping aperture array having multiple openings, and a multi-beam (multiple electron beams) is formed. A multi-beam passes through blankers respectively corresponding to the blanking aperture array. The blanking aperture array includes an electrode pair for deflecting a beam individually, and an opening for beam passage between the electrode pair, and one of the electrode pair (blanker) is fixed to the ground potential, and blanking deflection is performed individually on a passing electron beam by switching the other electrode between the ground potential and a potential other than the ground potential. An electron beam deflected by a blanker is shielded, and a sample is irradiated with an electron beam not deflected.

The blanking aperture array includes a circuit element for performing independent control over the electrode potential of each blanker. Thus, a blanking aperture array chip is fabricated by performing MEMS processing on an LSI chip in which circuit elements are formed, and forming electrode pairs and openings. Specifically, circuit elements are disposed directly under the electrodes, and around a beam passage hole. For this reason, when a multi-beam is formed by a shaping aperture array, scattering electrons scattered by an opening edge may collide with a circuit element mounted in the blanking aperture array, and an operation failure of the circuit element may be caused. In particular, when the energy of the electron beam at a blanking aperture position is several tens key, the range of the electrons in silicon is several microns or greater, thus electrons, which collide with an electrode or an opening sidewall and recoil, jump into an LSI circuit, and charge a circuit element.

DETAILED DESCRIPTION

In one embodiment, an aperture set for a multi-beam includes a shaping aperture array in which a plurality of first openings are formed, a region including the plurality of first openings is irradiated with a charged particle beam discharged from a discharge unit, and portions of the charged particle beam pass through the plurality of respective first openings to form a multi-beam, a first shield plate in which a plurality of second openings is formed, through which a corresponding beam in the multi-beam, which passes through the plurality of first openings, passes, and a blanking aperture array in which a plurality of third openings is formed, through which a corresponding beam in the multi-beam, which passes through the plurality of first openings and the plurality of second openings, passes. The second openings are wider than the first openings.

Hereinafter, an embodiment of the present invention will be described based on the drawings. In the embodiment, as an example of a charged particle beam, a configuration using an electron beam will be described. However, the charged particle beam is not be limited to an electron beam, and may be an ion beam or the like.

Figure 1:
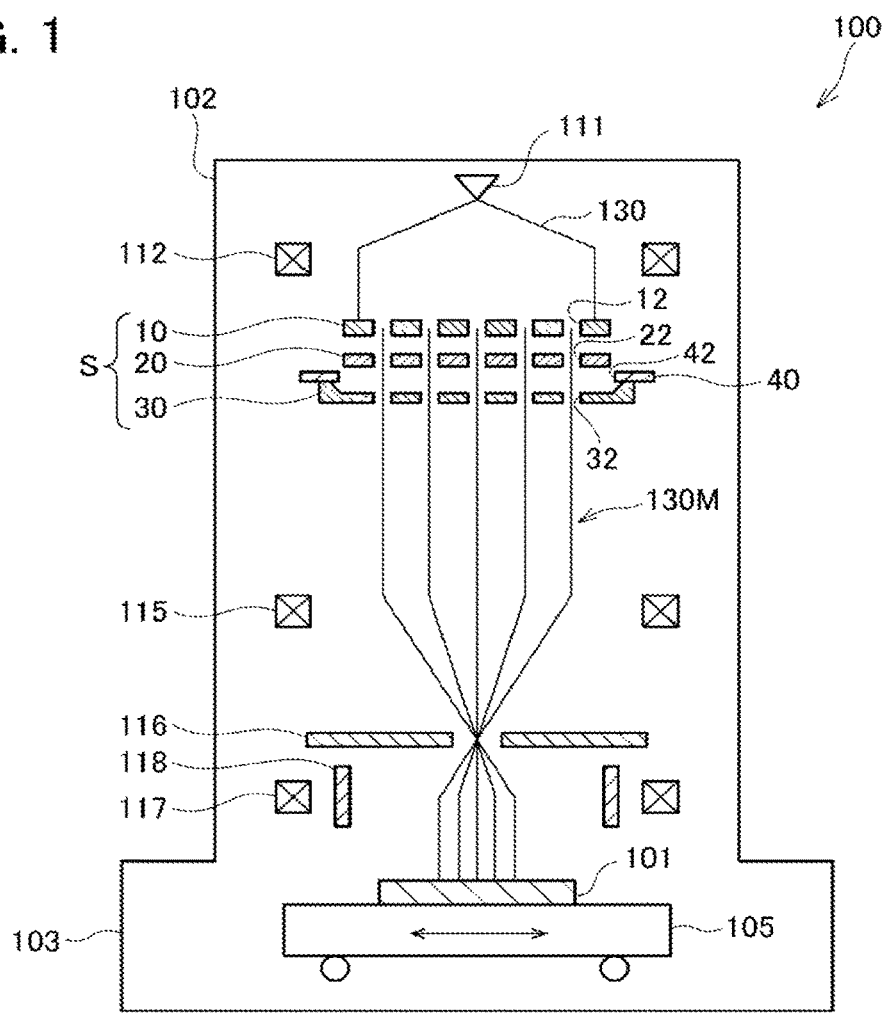
FIG. 1 is a schematic diagram of a multi-charged particle beam writing apparatus according to an embodiment of the present invention.

FIG. 1 is a schematic configuration diagram of a writing apparatus according to the embodiment. A writing apparatus 100 illustrated in FIG. 1 is an example of a multi-charged particle beam writing apparatus. The writing apparatus 100 includes an electronic lens barrel 102 and a writing chamber 103. In the electronic lens barrel 102, an electron gun 111, an illumination lens 112, an aperture set S, a reducing lens 115, a limiting aperture member 116, an objective lens 117, and a deflector 118 are disposed.

The aperture set S has a shaping aperture array 10, a shield plate (a first shield plate) 20, and a blanking aperture array 30. The blanking aperture array 30 is implemented (mounted) in a mounting substrate 40. An opening 42 for passage of an electron beam (multi-beam 130M) is formed at a central portion of a mounting substrate 40. When shaping the multi-beam 130M, the shaping aperture array 10 is heated and thermally expands to block most of the electron beam 130. For this reason, the shaping aperture array 10 is set on a movable stage, and the position is adjusted so that the multi-beam 130M penetrates the through holes of the blanking aperture array 30.

An XY stage 105 is disposed in the writing chamber 103. At the time of writing, a sample 101, such as a mask, which is a target substrate to be written is disposed on the XY stage 105. The sample 101 includes a mask for exposure when a semiconductor device is manufactured, or a semiconductor substrate (silicon wafer) in which a semiconductor device is manufactured. In addition, the sample 101 includes mask blanks to which a resist is applied and in which nothing has been written.

Figure 2:
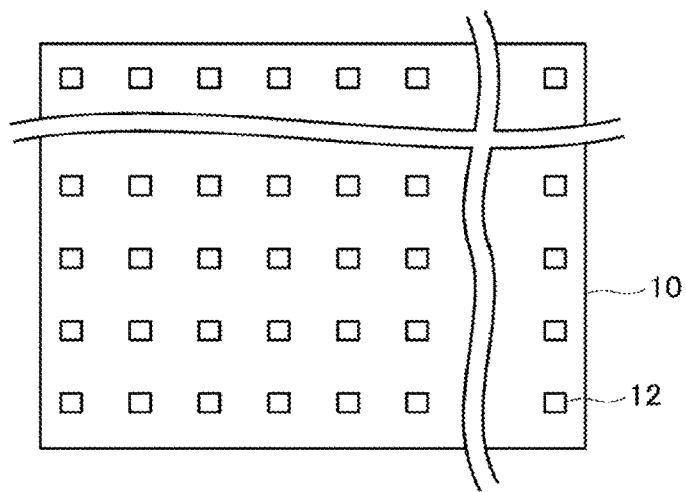
FIG. 2 is a plan view of a shaping aperture array.

As illustrated in FIG. 2, in the shaping aperture array 10, openings (first openings) 12 in m vertical columns x n horizontal columns (m, n≥2) are formed with a predetermined arrangement pitch. Each of the openings 12 is formed in a rectangle having the same dimensional shape. The shape of the opening 12 may be circular. Portions of the electron beam 130 pass through respective multiple openings 12, thereby forming the multi-beam 130M.

Figure 3:
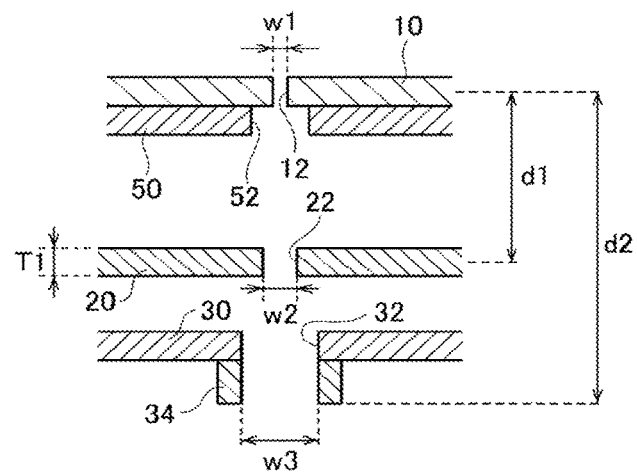
FIG. 3 is a sectional view of an aperture set according to the embodiment.

As illustrated in FIG. 3, an X ray shield plate 50 may be provided on the lower surface of the shaping aperture array 10. In the X ray shield plate 50, a passage hole 52 for electron beam passage is formed in alignment with the arrangement position of each opening 12 of the shaping aperture array 10. The X ray shield plate 50 is set to prevent damage to a circuit in the blanking aperture array 30 and photoconduction of the resist on a writing sample by attenuating the X-ray generated by braking radiation when an electron beam is blocked by the shaping aperture array 10.

The shield plate 20 is provided under the shaping aperture array 10, and an opening (second opening) 22 is formed in alignment with the arrangement position of each opening 12 of the shaping aperture array 10. The shield plate 20 is formed of, for instance, a silicon substrate, and a plate thickness T1 is greater than the range (approximately 15 μm) of the electron beam in the silicon substrate.

The blanking aperture array 30 is provided under the shield plate 20, and a passage hole (third opening) 32 is formed in alignment with the arrangement position of each opening 12 of the shaping aperture array 10. Blankers 34 including a set of two electrodes to be paired are disposed in each passage hole 32. One of the blankers is fixed to the ground potential, and the other blanker is switched between the ground potential and another potential. The electron beam, which passes through each passage hole 32, is independently deflected by a voltage applied to the blankers 34. In this manner, the multiple blankers 34 perform blanking deflection of a corresponding one of the multi-beam 130M which has passed through the multiple openings 12 of the shaping aperture array 10. A circuit that controls a blanker is directly under the blanker, and is within 10 μm from the surface (the lower side in FIG. 1) of a BAA chip, thus when an electron having an energy of several tens keV collides with the surface of the BAA chip, the electron reaches the circuit and causes charging or a failure. For this reason, in FIG. 1, the side of the BAA chip, on which the electrodes and circuits are provided, is set to the lower side (the emission side of a beam).

The electron beam 130 discharged from the electron gun 111 (discharge unit) approximately perpendicularly illuminates the entire shaping aperture array 10 by the illumination lens 112. The electron beam 130 passes through the multiple openings 12 of the shaping aperture array 10, thereby forming multiple electron beams (multi-beam) 130M. The multi-beam 130M passes through an opening 22 of the shield plate 20, and passes through corresponding one of the blankers 34 of the blanking aperture array 30.

The multi-beam 130M, which has passed through the blanking aperture array 30, is reduced by the reducing lens 115, and proceeds to the central hole of the limiting aperture member 116. Here, an electron beam deflected by the blankers 34 of the blanking aperture array 30 is displaced from the position of the central hole of the limiting aperture member 116, and is shielded by the limiting aperture member 116. On the other hand, the electron beam not deflected by the blankers 34 passes through the central hole of the limiting aperture member 116. Blanking control is performed by turning on/off of the blankers 34, and ON/OFF of the beam is controlled.

In this manner, the limiting aperture member 116 shields each beam which is deflected by the multiple blankers 34 to achieve a beam OFF state. A beam for one shot is formed by the beam which passes through the limiting aperture member 116 and is formed since beam ON is achieved until beam OFF is achieved.

The multi-beam, which passes through the limiting aperture member 116, is focused by the objective lens 117 to form a pattern image with a desired reduction rate. The entire multi-beam is collectively deflected by the deflector 118 in the same direction, and is emitted to a corresponding irradiation position on the sample 101 of each beam. When the XY stage 105 is continuously moved, the irradiation position of a beam is controlled by the deflector 118 so that the irradiation position follows the movement of the XY stage 105.

The multi-beams irradiated at once are ideally arranged at a pitch which is obtained by multiplying the layout pitch of the multiple openings 12 of the shaping aperture member 10 by the above-mentioned desired reduction rate. The writing apparatus 100 performs a writing operation by a raster scan system that sequentially irradiates with shot beams continuously, and when a desired pattern is written, an unnecessary beam is controlled to be beam OFF by the blanking control.

In the present embodiment, as illustrated in FIG. 3, a diameter (dimension, size) w2 of the opening 22 of the shield plate 20 is larger than a diameter w1 of each of the openings 12 of the shaping aperture array 10. The diameter w2 of the opening 22 is preferably smaller than a diameter w3 of the opening 32 of the blanking aperture array 30.

Let d1 be the heightwise distance from the shaping aperture array 10 to the shield plate 20, and d2 be the heightwise distance from the shaping aperture array 10 to the blanking aperture array 30 (the lower end of the electrodes of the blankers 34), then it is further preferable that $w2 < w3 \times (d1/d2)$ hold. For instance, it is possible to approximately set distance d1 to 10 mm, distance d2 to 9 mm, diameter w1 to 1 μm, diameter w2 to 8 μm, and diameter w3 to 10 μm.

Figure 4:
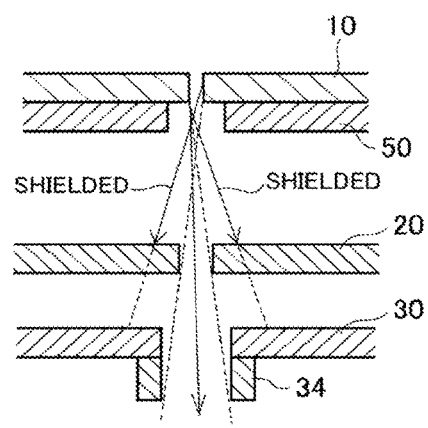
FIG. 4 is a diagram illustrating an example of beam shielded by a shield plate.

By setting the diameter w2 of the opening 22 to the above-mentioned size, as illustrated in FIG. 4, when an electron beam passes through each opening 12 of the shaping aperture array 10 to form a multi-beam, the shield plate 20 having a thickness of the range of the electron beam or greater can shield the scattered electrons generated by scattering of the electron beam by the edge of the opening 12, and can prevent the circuit elements mounted in the blanking aperture array 30 and the blankers 34 from being irradiated with the scattered electrons. Consequently, an occurrence of an operation failure of a circuit element by scattered electrons can be prevented. Also, when the shaping aperture array 10 is not correctly positioned with the blanking aperture array 30 (this is the case immediately after electron beam emission from the cathode 111 is started), it is possible to prevent an occurrence of an operation failure of a circuit element caused by irradiation of the blanking aperture array 30 with the multi-beam 130M. On the other hand, when the shaping aperture array 10 is correctly positioned with the blanking aperture array 30, as described above, the shield plate 20 blocks the scattered electrons but does not block the multi-beam 130M, and thus writing is not affected by the shield plate 20.

Figure 5A:
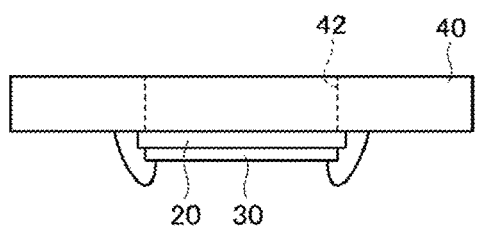
FIGS. 5A and 5B are side views illustrating an example of mounting of a shield plate.
Figure 5B:
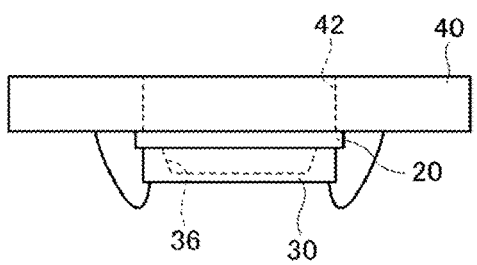

Although FIG. 1 illustrates that the shield plate 20 is positioned over the mounting substrate 40, as illustrated in FIGS. 5A and 5B, the shield plate 20 may be set between the mounting substrate 40 and the blanking aperture array 30. In this case, first, the blanking aperture array 30 and the shield plate 20 are bonded in alignment with the positions of the opening 32 and the opening 22. Subsequently, the bonded structure of the blanking aperture array 30 and the shield plate is mounted on the mounting substrate 40, and circuits are connected by die bonding or wire bonding. It is to be noted that FIG. 5B illustrates an example in which the blanking aperture array 30 has a membrane structure with a recessed portion 36 formed on one side of the blanking aperture array 30.

Figure 6:
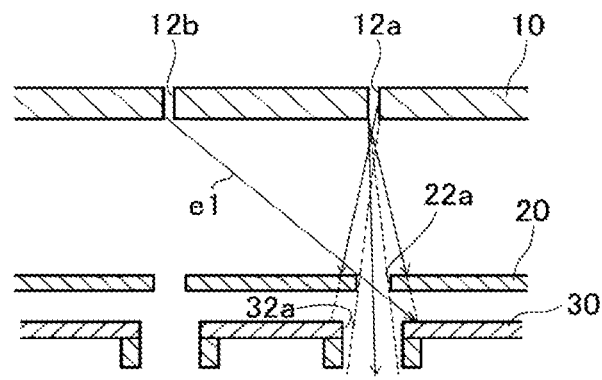
FIG. 6 is a diagram illustrating an example in which a beam passes through the shield plate in a diagonal direction.

As illustrated in FIG. 6, the electrons, which have passed through the opening 22a of the shield plate 20, corresponding to the opening 12a among the electrons (including the electrons scattered by the opening 12a) which have passed through the opening 12a of the shaping aperture array 10, pass through an opening 32a of the blanking aperture array 30, and do not collide with the circuit elements provided in the blanking aperture array 30.

However, depending on the relationship between the distance between the shaping aperture array 10 and the shield plate 20, the distance between the shield plate 20 and the blanking aperture array 30, the size of the diameter w2 of the opening 22, and the size of the diameter w3 of the opening 32, as illustrated in FIG. 6, an electron e1 scattered by an opening 12b around the opening 12a may pass through the opening 22a and the blanking aperture array 30 may be irradiated with the electron e1.

Figure 7:
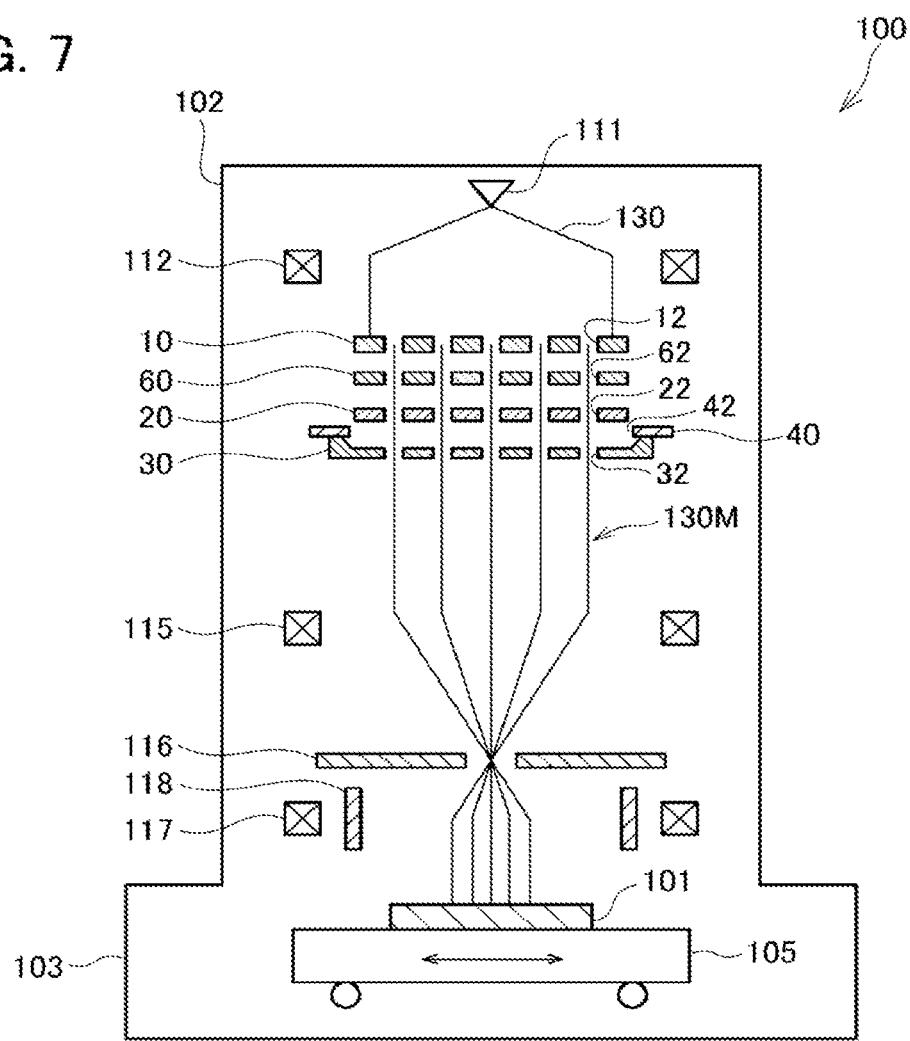
FIG. 7 is a schematic diagram of a multi-charged particle beam writing apparatus according to another embodiment.
Figure 8:
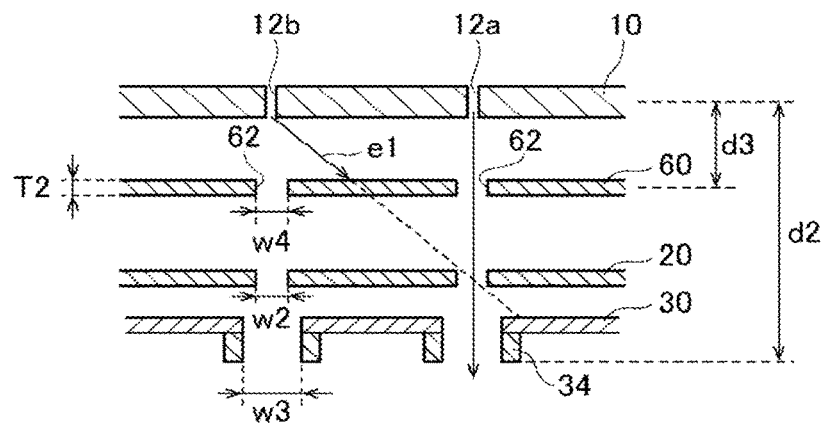
FIG. 8 is a sectional view of an aperture set according to another embodiment.

In order to shield such a scattered electron e1 in a diagonal direction, as illustrated in FIG. 7 and FIG. 8, it is preferable to provide a pre-shield plate (a second shield plate) 60 between the shaping aperture array 10 and the shield plate 20.

In the pre-shield plate 60, an opening (fourth opening) 62 is formed in alignment with the arrangement position of each opening 12 of the shaping aperture array 10. The pre-shield plate 60 is formed of, for instance, a silicon substrate, and a plate thickness T2 is greater than the range (approximately 15 μm) of the electron beam.

A diameter w4 of the opening 62 is greater than the diameter w1 of the opening 12 of the shaping aperture array 10. Also, the diameter w4 of the opening 62 is preferably smaller than the diameter W3 of the opening 32 of the blanking aperture array 30.

Let d3 be the heightwise distance from the shaping aperture array 10 to the pre-shield plate 60, and d2 be the heightwise distance from the shaping aperture array 10 to the blanking aperture array 30 (the lower end of the electrodes of the blankers 34), then it is preferable that w4<w3× (d3/d2) hold.

Figure 9:
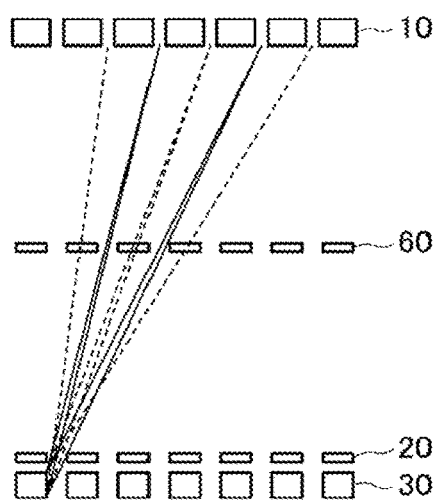
FIG. 9 is a diagram illustrating an example of a beam passing through a pre-shield plate and a shielded beam.
Figure 10:
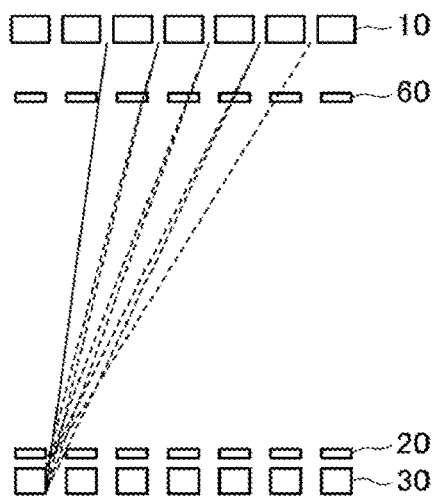
FIG. 10 is a diagram illustrating an example of a beam passing through a pre-shield plate and a shielded beam.
Figure 11:
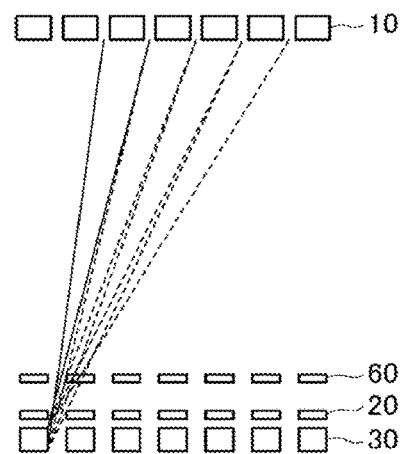
FIG. 11 is a diagram illustrating an example of a beam passing through a pre-shield plate and a shielded beam.

The setting portion of the pre-shield plate 60 is not particularly restricted as long as the setting portion is between the shaping aperture array 10 and the shield plates 20. However, when the pre-shield plate 60 is set in the vicinity of the shaping aperture array 10 as illustrated in FIG. 10 or is set in the vicinity of the shield plate 20 as illustrated in FIG. 11, the scattered electron blocking capability is higher, as compared with the case where the pre-shield plate 60 is set at an intermediate point between the shaping aperture array 10 and the shield plate 20 as illustrated in FIG. 9. It is to be noted that in FIGS. 9 to 11, a scattering electron that reaches the blanking aperture array 30 is illustrated by a solid line, and a scattering electron shielded by the pre-shield plate 60 is illustrated by a dashed line.

Here, "the pre-shield plate 60 is set in the vicinity of the shaping aperture array 10" indicates that the heightwise distance d3 from the shaping aperture array 10 to the pre-shield plate 60 is equal to or less than ¼ the heightwise distance from the shaping aperture array 10 to the shield plate 20, for instance. On the other hand, "the pre-shield plate 60 is set in the vicinity of the shield plate 20" indicates that the distance d3 is greater than or equal to ¾ the distance d1.

Figure 12A:
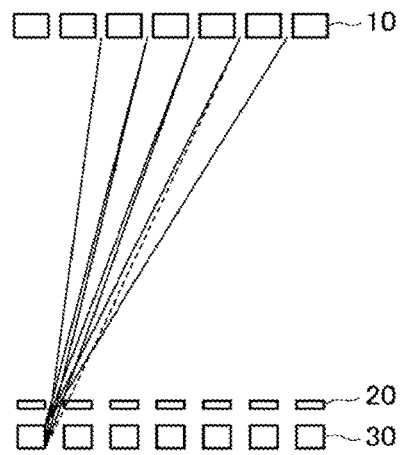
FIGS. 12A and 12B are diagrams illustrating an example of a beam passing through a shield plate and a shielded beam.
Figure 12B:
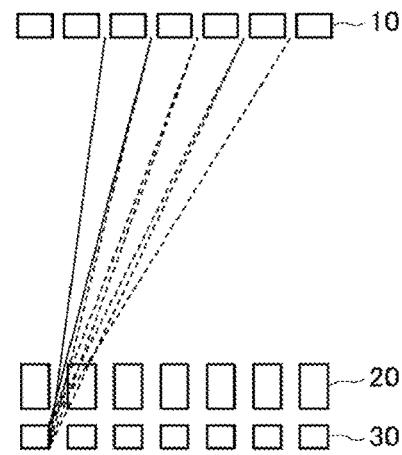

As illustrated in FIGS. 12A and 12B, the greater the plate thickness of the shield plate 20 (and the pre-shield plate 60), the higher the scattered electron blocking capability. However, the diameter w2 of the opening 22 is small, and it is difficult to increase the plate thickness of the shield plate 20 in consideration of the aspect ratio of processing.

Figure 13:
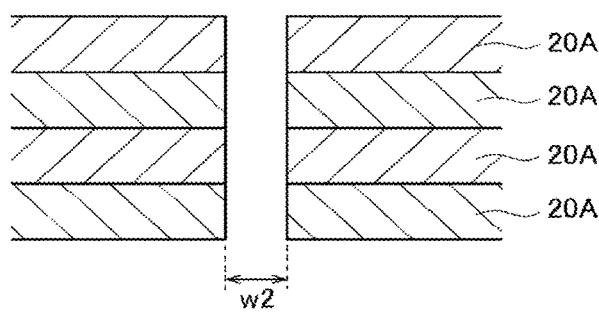
FIG. 13 is a sectional view of a shield plate according to a variation.

Thus, as illustrated in FIG. 13, a shield plate having an opening of a high aspect ratio may be produced by stacking multiple shield plates 20A (thin shield plates) each with a small plate thickness and an opening of the diameter w2. However, when a positional gap occurs between layers, the substantial diameter is smaller than w2.

Figure 14:
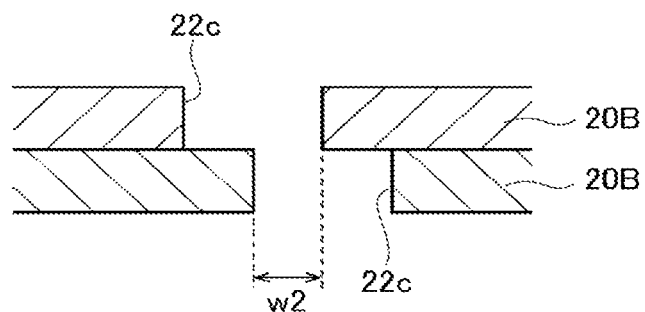
FIG. 14 is a sectional view of a shield plate according to a variation.

Conversely, as illustrated in FIG. 14, a shield plate having an opening of a desired diameter w2 may be produced by preparing multiple shield plates 20B (thin shield plates) each having an opening larger than a desired diameter w2 and stacking multiple shield plates 20B with the position of each opening 22c displaced. The multiple shield plates 20B may be disposed at an interval from each other.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. An aperture set for a multi-beam, comprising:
 a shaping aperture array in which a plurality of first openings are formed, a region including the plurality of first openings is irradiated with a charged particle beam discharged from a discharge unit, and portions of the charged particle beam pass through the plurality of respective first openings to form a multi-beam;

a first shield plate in which a plurality of second openings is formed, through which a corresponding beam in the multi-beam, which passes through the plurality of first openings, passes; and a blanking aperture array in which a plurality of third openings is formed, through which a corresponding beam in the multi-beam, which passes through the plurality of first openings and the plurality of second openings, passes, wherein the second openings are wider than the first openings.

2. The aperture set for a multi-beam according to claim 1, wherein the second openings are narrower than the third openings.

3. The aperture set for a multi-beam according to claim 2, wherein let d1 be a distance from the shaping aperture array to the first shield plate, d2 be a distance from the shaping aperture array to the blanking aperture array, w2 be a diameter of the second opening, and w3 be a diameter of the third opening, then w2<w3×(d1/d2) holds.

4. The aperture set for a multi-beam according to claim 1, wherein the first shield plate is bonded to the blanking aperture array.

5. The aperture set for a multi-beam according to claim 1, wherein a plate thickness of the first shield plate is larger than a range of the charged particle beam in the first shield plate.

6. The aperture set for a multi-beam according to claim 1, further comprising a second shield plate which is provided between the shaping aperture array and the first shield plate, and in which a plurality of fourth openings is formed, through which a corresponding beam in the multi-beam, which passes through the plurality of first openings, passes.

7. The aperture set for a multi-beam according to claim 6, wherein the fourth openings are wider than the first openings.

8. The aperture set for a multi-beam according to claim 7, wherein the fourth openings are narrower than the third openings.

9. The aperture set for a multi-beam according to claim 8, wherein let d3 be a distance from the shaping aperture array to the second shield plate, d2 be a distance from the shaping aperture array to the blanking aperture array, w4 be a diameter of the fourth openings, and w3 be a diameter of the third openings, then w4<w3×(d3/d2) holds.

10. The aperture set for a multi-beam according to claim 1, wherein the first shield plate includes a plurality of thin shield plates stacked, and an opening is formed in each of the plurality of thin shield plates.

11. The aperture set for a multi-beam according to claim 10, wherein the plurality of thin shield plates is stacked with a position of the opening displaced.

12. A multi-charged particle beam writing apparatus comprising:

a discharge unit that discharges a charged particle beam;

a shaping aperture array in which a plurality of first openings are formed, a region including the plurality of first openings is irradiated with the charged particle beam, and portions of the charged particle beam pass through the plurality of respective first openings to form a multi-beam;

a first shield plate in which a plurality of second openings is formed, through which a corresponding beam in the multi-beam, which passes through the plurality of first openings, passes; and a blanking aperture array in which a plurality of third openings is formed, through which a corresponding beam in the multi-beam, which passes through the plurality of first openings and the plurality of second openings, passes, wherein the second openings are wider than the first openings.

13. The apparatus according to claim 12, wherein the second openings are narrower than the third openings.

14. The apparatus according to claim 12, wherein the first shield plate is bonded to the blanking aperture array.

15. The apparatus according to claim 12, wherein a plate thickness of the first shield plate is larger than a range of the charged particle beam in the first shield plate.

16. The apparatus according to claim 12, further comprising a second shield plate which is provided between the shaping aperture array and the first shield plate, and in which a plurality of fourth openings is formed, through which a corresponding beam in the multi-beam, which passes through the plurality of first openings, passes.

17. The apparatus according to claim 16, wherein the fourth openings are wider than the first openings.

18. The apparatus according to claim 17, wherein the fourth openings are narrower than the third openings.

19. The apparatus according to claim 12, wherein the first shield plate includes a plurality of thin shield plates stacked, and an opening is formed in each of the plurality of thin shield plates.

20. The apparatus according to claim 19, wherein the plurality of thin shield plates is stacked with a position of the opening displaced.

* * * * *